United States Patent
Cyrille et al.

(10) Patent No.: US 8,098,105 B2
(45) Date of Patent: Jan. 17, 2012

(54) SPIN-VALVE OR TUNNEL-JUNCTION RADIO-FREQUENCY OSCILLATOR

(75) Inventors: Marie-Claire Cyrille, Sinard (FR); Bertrand Delaet, Bernin (FR); Jean-Francois Nodin, Saint Egreve (FR); Veronique Sousa, Grenoble (FR)

(73) Assignee: Commissariat à l'Energie Atomique, Paris (FR)

( * ) Notice: Subject to any disclaimer, the term of this patent is extended or adjusted under 35 U.S.C. 154(b) by 14 days.

(21) Appl. No.: 12/620,922

(22) Filed: Nov. 18, 2009

(65) Prior Publication Data
US 2010/0134196 A1 Jun. 3, 2010

(30) Foreign Application Priority Data
Dec. 1, 2008 (FR) .................................. 08 58161

(51) Int. Cl.
*H01S 1/00* (2006.01)
*H01L 29/82* (2006.01)
*H03B 5/40* (2006.01)

(52) U.S. Cl. ................. 331/94.1; 331/96; 257/421

(58) Field of Classification Search ............ 331/3, 94.1, 331/96, 157, 187; 257/295, 421, 422; 360/324; 428/212, 811
See application file for complete search history.

(56) References Cited

U.S. PATENT DOCUMENTS

| | | | |
|---|---|---|---|
| 5,695,864 A | 12/1997 | Slonczewski | |
| 6,365,017 B1 * | 4/2002 | Hongo et al. | 204/212 |
| 6,936,496 B2 * | 8/2005 | Meyer et al. | 438/99 |
| 7,381,480 B2 * | 6/2008 | Nakamura et al. | 428/811.5 |
| 7,423,281 B2 * | 9/2008 | Rohr | 257/2 |
| 7,486,486 B2 * | 2/2009 | Nakamura et al. | 360/324 |
| 7,538,402 B2 * | 5/2009 | Fukumoto | 257/421 |
| 7,732,881 B2 * | 6/2010 | Wang | 257/421 |
| 2007/0109147 A1 | 5/2007 | Fukuzawa et al. | |
| 2008/0074806 A1 | 3/2008 | Sato et al. | |

OTHER PUBLICATIONS

Shehzaad Kaka, et al., Mutual Phase-Locking of Microwave Spin Torque Nano-Oscillators, Nature, vol. 437, Sep. 15, 2005, pp. 389-392.

Republique Francaise, Rapport De Recherche Preliminaire, dated Jun. 9, 2009, 2 pgs. in French language.

* cited by examiner

*Primary Examiner* — Levi Gannon

(57) ABSTRACT

This radio-frequency oscillator includes a magnetoresistive device in which an electric current is able to flow. The magnetoresistive device includes a first magnetic layer, known as a "trapped layer", whereof the magnetization is of fixed direction. The magnetoresistive device further includes a second magnetic layer known as a "free layer" and a non-magnetic layer, known as an "intermediate layer", interposed between the first and second layer, known as the intermediate layer. The oscillator further includes means capable of causing an electron current to flow in said layers constituting the aforementioned stack and in a direction perpendicular to the plane which contains said layers. One of the three layers constituting the magnetoresistive device includes at least one constriction zone of the electric current passing through it.

12 Claims, 2 Drawing Sheets

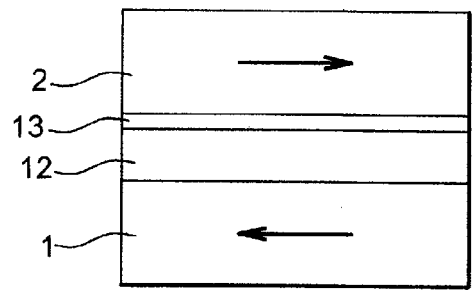
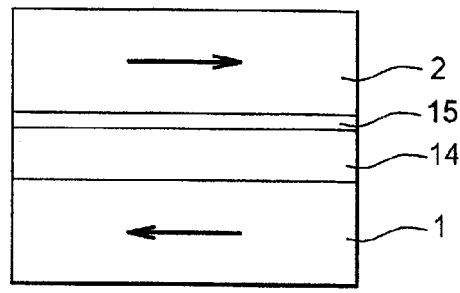
Fig. 3a   Fig. 4a
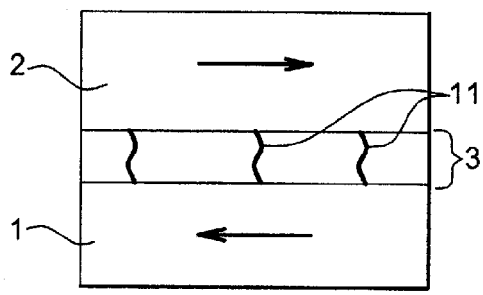
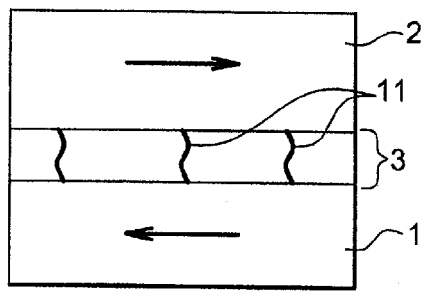
Fig. 3b   Fig. 4b
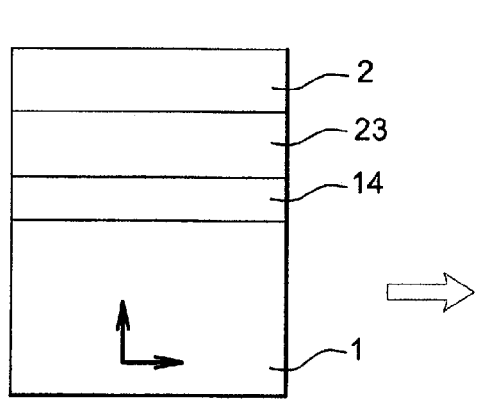
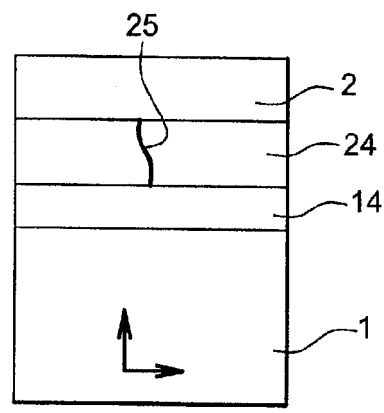
Fig. 5a   Fig. 5b

SPIN-VALVE OR TUNNEL-JUNCTION RADIO-FREQUENCY OSCILLATOR

CROSS REFERENCE TO RELATED APPLICATIONS

This application claims priority under 35 U.S.C. §119 from French Patent Application No. 0858161 filed on Dec. 1, 2008 in the French Patent Office, the entire disclosure of which is incorporated herein by reference.

FIELD OF THE INVENTION

The present invention belongs to the field of radio-frequency oscillators employing thin layer magnetic systems technology.

It is more specifically targeted at radio-frequency oscillators of this kind that employ magnetic spin valves or tunnel junctions comprising a magnetic stack of at least one free magnetic layer, a trapped magnetic layer, said layers being interfaced by an intermediate layer.

BACKGROUND OF THE INVENTION

Radio-frequency oscillators are intended to operate in high frequency ranges typically of between a few tens of megahertz and a few tens of gigahertz.

To satisfy the expectations that have arisen from the development of mobile telephony in particular (cell phones, mobiles), as well as from the saturation of the frequency bands allocated to telecommunications, it has been proposed to replace the static allocation of said frequency bands by a dynamic allocation. This principle relies on the capacity to analyse the frequency spectrum, and to identify the free frequency bands in order to be able to use them. This is then known as "opportunistic radio".

However, in order to apply this dynamic frequency allocation principle, the devices that apply it must have very wide band oscillators, and furthermore be outstanding in terms of phase noise, and therefore have a high coefficient of quality $Q=f/\Delta f$.

One technical solution suitable for meeting these expectations comprises the employment of spin electronics radio-frequency oscillators. Oscillators of this kind allow a wide frequency band with a high quality factor Q, together with easy frequency tunability and employ a relatively straightforward architecture.

Spin electronics uses electron spin as an additional degree of freedom, to generate new effects.

It has been shown that by passing a spin polarized current through a thin magnetic layer, a reversal of its magnetization is produced in the absence of any external magnetic field. The spin polarized current is also able to generate sustained magnetic excitations, also known as oscillations. Using the effect of generating sustained magnetic excitations in a magnetoresistive device makes it possible to convert this effect into an electrical resistance modulation that can be directly used in electronic circuits and thus, consequently, is capable of acting directly at the level of frequency.

The document U.S. Pat. No. 5,695,864 describes various developments that apply the abovementioned principle, and describes in particular the magnetization precession of a magnetic layer passed through by a spin polarized electric current. A stack of magnetic layers capable of constituting a radio-frequency oscillator of this kind has been shown in relation to FIG. 1. This stack is inserted between two electrical contact zones 5', 5, made for example out of copper or gold.

The layer 2 of this stack, the so-called "trapped layer", has a fixed direction magnetization. It may consist of a single layer, with a typical thickness of between 5 and 100 nanometres, and be made for example out of cobalt, or more generally out of an alloy based on cobalt and/or iron and/or nickel (for example CoFe or NiFe). This trapped layer 2 may be single or synthetic. It fulfils the polarizer function. Thus, electrons of the electric current passing through the constituent layers of the magnetoresistive device perpendicular to the plane thereof, reflected or transmitted by the polarizer, are polarized with a spin direction parallel to the magnetization that the layer 2 has at the interface opposite that in contact with an antiferromagnetic layer 6, with which it is associated and intended to fix the orientation of the magnetization thereof.

This layer 2 receives on its face opposite the face receiving the antiferromagnetic layer 6 another layer 3 acting as a spacer. This layer 3 is metal, and typically a layer of copper between 3 and 10 nanometres thick, or is constituted by a fine insulating layer of aluminium oxide, with a typical thickness of between 0.5 and 1.5 nanometre, or magnesium oxide, with a typical thickness of between 0.5 and 3 nanometres. On the other side of the spacer 3, is installed a so-called "free layer" 1, generally not as thick as the layer 2. This layer may be single or composite. It may also be coupled with an antiferromagnetic layer 4 added thereto on its face opposite the interface of the layer 1 with the spacer 3, it must simply remain more "free" than the trapped layer. This layer 4 is for example constituted by an alloy such as $Ir_{80}Mn_{20}$, FeMn or PtMn.

The material of the layer 1 is generally an alloy based on cobalt and/or iron and/or nickel.

With prior art devices, very fine radio-frequency emissions are thus obtained in a strong magnetic field and out of plane. However, the amplitude of the wanted signal remains low, which may prove totally unacceptable for some applications. The spectrum analyser has thus measured in respect of spin valves powers (integrated on the RF band) of the order of −100 dBm and in respect of tunnel junctions of the order of −40 dBm. This power takes into account the variation in dynamic resistance generated by the oscillation in the magnetization of the magnetoresistance.

A description has been given, for example in the document US 2007/109147 of a radio-frequency oscillator constituted by a stack of magnetic layers interspersed by an intermediate layer made out of an insulating material and provided with pathways for the electric current passing through said stack, known as confined current pathways.

However, the number of these pathways is not adjustable, and additionally, their diameter is random. By this method, oscillators are generated that are not tuned, which degrades the line width.

Thus, the first objective sought by the present invention is to retain or even improve the quality of the radio-frequency emissions in terms of fineness, while significantly increasing the power in order to get as close as possible to the powers required for such oscillators to be used in radio-frequency reception chains.

SUMMARY OF THE INVENTION

The invention therefore proposes a radio-frequency oscillator comprising a magnetoresistive device in which an electric current is able to flow. This magnetoresistive device or stack includes:
  a first magnetic layer, known as a "trapped layer", whereof the magnetization is of fixed direction;
  a second magnetic layer known as a "free layer"; and a non-magnetic layer, known as an "intermediate layer", interposed between the first and second layer, and made out of an insulating material.

It also includes means capable of causing an electron current to flow in said constituent layers of the aforementioned stack and in a direction perpendicular to the plane which contains said layers.

According to the invention, the magnetoresistive device comprises at least one constriction zone of the electric current passing through it, said at least one constriction zone being constituted by a nano-path or nano-wire extending between the trapped layer and the free layer, and resulting from the subjection of a specific stack implemented between said free and trapped layers to a voltage suitable for generating it, said stack being constituted by a bi-layer consisting of a solid electrolyte onto which has been deposited a soluble metal electrode, partially dissolved in said electrolyte either by photodissolution (UV), or by heat treatment.

It is observed in fact that through the presence of one or more of such constrictions in the magnetoresistive stack, strong current densities are created locally and may induce local precession of the magnetization of the free layer, even if this is of micrometric size (i.e. diameter). Because of this possibility of having stronger local current densities, the variation in dynamic resistance is greater and the wanted signal is therefore higher. It is even possible, for very high current densities, to reach states where the magnetization precession of said free layer is done at wide angles and outside the plane of said layer (and no longer in the plane as it is for the lowest current densities). In this case, radio-frequency excitations of even greater amplitude are obtained, since the magnetization trajectories induce a magnetization oscillation of 360° in the plane, thereby taking advantage of the totality of the amplitude of the magnetoresistance.

To advantage, several of these constrictions are implemented in the layer under consideration, making it then possible to obtain not one but N oscillators (in a plane perpendicular to the current direction), then in parallel. It has been shown (see "*Mutual Phase-locking of Microwave Spin Torque Nano-Oscillators*"—S. Kaka, M R. Pufall, W H. Rippard et al; NATURE Vol. 437, issue: 7057, pages 389-392, 2005) that, in this case, oscillators in parallel may be coupled by spin wave and emit coherently. The total power emitted is then proportionate to $N^2$.

The constriction zones so obtained have typical diameters extending between 1 and a few tens of nanometres.

According to one advantageous alternative, it is possible to join to the magnetoresistive stack a polarizer with perpendicular magnetization relative to the plane of the constituent layers of the stack, said polarizer being positioned adjacent to the free layer.

This polarizer may typically be made out of an alloy based on cobalt and platinum or cobalt and gadolinium or a cobalt/platinum multi-layer or again a cobalt/nickel multi-layer on a layer of platinum.

Employing a polarizer of this type makes it possible to induce the formation of radio-frequency oscillations in zero applied magnetic field and of greater amplitude while applying lower current densities. The polarizer is separated from said free layer by a metal spacer, also made for example of copper.

According to a first inventive embodiment, the bi-layer constitutes the intermediate layer.

The solid electrolyte may consist of a chalcogenide-based insulating matrix, such as for example GeSe, GeS, CuS, $Ag_2S$, and the soluble electrode is for example constituted by copper or silver.

It is known that by playing on the voltage applied to said bi-layer, it is possible to vary the diameter and therefore the resistance of the nano-wires.

According to one alternative to the previous embodiment, it is also possible to replace the chalcogenide by a tunnel oxide such as $SiO_2$, $TiO_2$, $NiO_2$, $SrTiO_3$, MgO, $Al_2O_3$.

According to a second inventive embodiment, the constriction(s) is (are) provided above the intermediate layer, and then constituted by a spacer. The spacer is either a non-conductor (a tunnel barrier), or metal in nature (a tunnel junction). This or these constrictions are the result of using a solid electrolyte associated with a soluble electrode, in the case in point constituted by the magnetic layer of said trapped layer which is dissolved in the solid electrolyte by photodissolution or heat treatment. By applying a voltage above a threshold voltage (cf. above), a ferromagnetic conductive filament is thus irreversibly formed over the tunnel barrier whereof the diameter depends on the voltage applied, and to be more precise in the matrix resulting from the partial dissolution of the magnetic layer of the trapped layer in the solid electrolyte.

The invention is also targeted at a method for implementing a radio-frequency oscillator in accordance with those previously described.

This method comprises building into a substrate, typically made out of silicon, the electrically conductive lower electrode, intended to implement the magnetization precession of one of the layers of a magnetic stack, deposited on said substrate, said stack being constituted by two layers of ferromagnetic materials such as in particular a CoFe or NiFe alloy, separated from one another by an insulating material and particularly an oxide such as for example alumina, in order to constitute a magnetic tunnel junction, or by a metal material (spin valve).

According to a first inventive alternative, onto the lower ferromagnetic material layer of the stack, is deposited by Physical Vapour Deposition (PVD), Chemical Vapour Deposition (CVD), or by evaporation, a layer constituting a solid electrolyte, such as a GeSe or GeS or GeTe or $As_2Se$ chalcogenide with a thickness that varies between 1 and 5 nanometres. A deposition is then made using the same technology of a soluble electrode, constituted by silver or copper or zinc or indium and platinum, and also with a thickness of between 1 and 5 nanometres before dissolution treatment.

The bi-layer so produced is then subjected to ultra-violet treatment or heat treatment, leading to the at least partial dissolution of the soluble electrode in the solid electrolyte. This then leads for example to the formation of a CuGeSe or CuGeS or AgGeSe or AgGeS matrix.

The stack so treated is then subjected to a voltage $V>V_{th}$; $V_{th}$ being a threshold voltage typically of between 0.2 V and 1 V, and consequently an electric current $I>I_{sat}$ is made to flow through the bi-layer. One or more permanent or irreversible conductive nano-paths are thus implemented, whereof the size and electric resistance are fixed by the saturation current.

An electrically conducting upper electrode is then deposited.

A constriction zone is then obtained which is quite particularly localized, and in particular limited to a few atoms or a few nanometres as a function of the injected compliance current ($I_{sat}$) without however losing electrical conductivity.

Moreover, this embodiment means that very good integration, and therefore a confinement, is produced. This technology proves furthermore relatively easy to industrialize on account of the straightforwardness of manufacture: straightforward deposition techniques, and dissolution stage. Additionally, it leads to high integration density. Lastly, it allows optimization of oscillator performance, on account of the extremely localized current injection.

The upper electrode is generally deposited after partial dissolution of the soluble electrode in the solid electrolyte. However, under present-day techniques it is conceivable for this electrode to be deposited prior to dissolution of the soluble electrode.

According to another inventive implementation method, onto the intermediate layer made out of tunnel oxide or metal material, is deposited by PVD, CVD, or by evaporation, a layer constituting a solid electrolyte, such as a GeSe or GeS or GeTe or $As_2Se$ chalcogenide with a thickness that varies between 5 and 50 nanometres.

Onto this layer is deposited the layer constituting the other ferromagnetic layer, in the case in point cobalt, and intended to act partially as soluble electrode.

The bi-layer so implemented is then subjected to ultra-violet treatment or heat treatment, leading to the at least partial dissolution of the soluble electrode in the solid electrolyte.

The stack so obtained is then subjected to the same treatment as the one previously described, for the purpose of leading to the implementation of one or more nano-wires or nano-paths. But this time, they are not implemented in the intermediate layer, but above it.

BRIEF DESCRIPTION OF THE FIGURES

The way in which the invention may be embodied, and the resulting advantages, will become clearer from the following embodiment examples, given for information purposes and non-restrictively, supported by the appended figures and wherein the same reference numbers correspond to the same elements:

FIGS. 3a and 3b show diagrammatically the implementation of a solid electrolyte/soluble electrode bi-layer for making the structure described in FIG. 2;

FIGS. 4a and 4b show an alternative to FIGS. 3a and 3b; and

FIGS. 5a and 5b show another embodiment of the invention, also implementing a solid electrolyte/soluble electrode bi-layer, this being constituted by the ferromagnetic layer of the trapped layer.

EMBODIMENTS OF THE INVENTION

In these figures, only the stacks of magnetic layers have been specifically shown.

In these, the free oscillating layer 1 has a typical thickness of between 2 and 50 nanometres. It is made on the basis of alloys of iron, cobalt and nickel such as for example CoFe, CoFeB, NiFe, etc.

The trapped layer 2 is of equivalent thickness and is made out of the same material. Its magnetization is trapped in the plane of said layer through exchange interaction with an antiferromagnetic layer as made for example on the basis of PtMn, IrMn, NiMn alloys, and not shown in said figures in the interests of clarity.

These two ferromagnetic layers, free layer 1 and trapped layer 2 respectively are separated from one another by an intermediate layer 3, made out of an insulating material.

According to the invention, constrictions are implemented within the stack so described in terms of electric conduction, orientated perpendicular to the plane of the layers, or parallel to the direction of the electric current passing through said stack. These constrictions have a diameter that varies typically between 1 and a few tens of nanometres. After the stack is implemented, it may be structured (or patterned) to give it a circular transverse cross-section, with the stacks then being called "pillars". The diameter of these pillars is able to vary between 50 and a few hundred nanometres.

Figure 1:
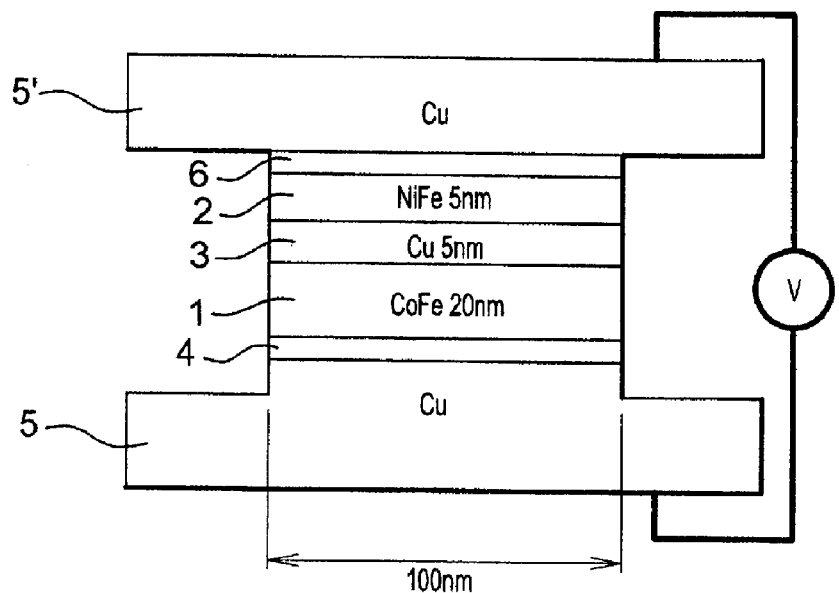
FIG. 1 is a diagrammatic representation of a radio-frequency oscillator in accordance with the prior art.
Figure 2:
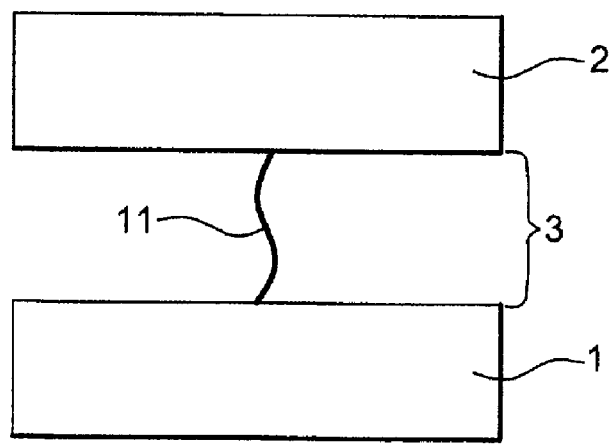
FIG. 2 is an illustration of a first inventive embodiment that implements a conductive nano-path between the free layer and the trapped layer.

According to a first inventive embodiment, shown in FIG. 2, the nano-constrictions are constituted by one or more conductive paths or wires 11 extending between the free layer 1 and the trapped layer 2. In this embodiment, the intermediate layer acting as spacer 3 is constituted by a bi-layer, constituted respectively prior to any treatment of a solid electrolyte 12 and soluble electrode 13.

The solid electrolyte 12 is for example constituted by a chalcogenide such as GeSe, GeS, GeTe, $Ag_2S$, CuS with a typical thickness of between 1 and 5 nanometres, and the soluble electrode 13 is for example constituted by a layer of copper or silver with a thickness of between 1 and 10 nanometres (see FIGS. 3a and 3b).

The solid electrolyte is deposited onto the free layer 1 using conventional techniques, such as Physical Vapour Deposition (PVD), Chemical Vapour Deposition (CVD) or by evaporation. These deposition techniques also apply for the soluble electrode.

To lead to the creation of a conductive nano-path or nano-wire 11, constituting the constriction specified by the invention, the bi-layer so constituted is firstly subjected to photo-dissolution treatment (by ultra-violet treatment for example) or heat treatment, leading to the at least partial dissolution of the layer 13 constituting the soluble electrode in a solid electrolyte 12.

This then leads for example to the formation of a CuGeSe or CuGeS or AgGeS type matrix. The thickness of the electrode is not altered in any significant way.

After dissolution treatment of the soluble electrode in the solid electrolyte, the trapped layer 2 is deposited, and then the whole of the stack described, i.e. trapped layer, bi-layer and free layer, is subjected to a voltage above the threshold voltage $V_{th}$, typically of between 0.2 Volt and 1 Volt. Conductive nano-paths or nano-wires are created irreversibly and therefore permanently between the trapped layer and the free layer. The size and electrical resistance of these nano-paths are fixed by the saturation current. This therefore gives constriction zones limited to a few atoms or to a few nanometres, allowing high current densities to be obtained at this level, an objective pursued by the present invention. This voltage depends on the materials at work in the bi-layer and on the thickness of this bi-layer.

This particular embodiment allows the resistance of the device and the width of the nano-path to be controlled by adjusting the polarization voltage of the Vbias device.

Moreover, it means that devices can be manufactured of large diameter, and typically of several hundred nanometres, since the current passing through the device is confined by the nano-paths.

If necessary, the assembly obtained may be subjected to a static magnetic field of a few ten to a few hundred Oersteds in order to induce radio-frequency excitations in the free layer 1.

A number N of nano-constrictions 8 in parallel is obtained, in one and the same plane parallel to the plane of said layers, limiting the passage of the electric current I passing through the stack in a direction perpendicular to this plane. The result is a local increase in the current density in each of these constrictions, inducing, in the presence of an external magnetic field, local precession of the magnetization of the free layer 1.

Because of the presence of these different constrictions, N nano-oscillators are obtained coupled by spin waves within one and the same device.

According to one alternative of this embodiment specified in FIGS. 4a and 4b, the bi-layer constituting the intermediate layer 3 consists of an oxide 14 acting as a tunnel barrier such as $SiO_2$, $TiO_2$, $NiO_2$, $SrTiO_3$, MgO, $Al_2O_3$, with a typical thickness of between 1 and 5 nanometres, and a soluble electrode 15 made for example out of copper or silver. The soluble electrode may be partially dissolved in the tunnel oxide by heat treatment of the anneal type.

In this case too, by applying to the device a voltage above the threshold voltage, one or more copper or silver filaments are formed inside the tunnel oxide, allowing the current to be confined inside the device.

According to one inventive embodiment shown in FIGS. 5a and 5b, the constrictions are made by conductive paths, not implemented this time within the intermediate layer 3 acting as spacer, but above it.

To this end, onto the layer of tunnel oxide 14, itself deposited on the free layer 1, and constituted for example by AlOx, MgO, StO with a typical thickness of between 1 and 2 nanometres, is deposited a chalcogenide-based insulating matrix 23, such as for example GeSe, GeS, CuS, $Ag_2S$, with a thickness of between 1 and 5 nanometres.

Above the assembly so implemented is deposited a ferromagnetic layer made for example out of cobalt, constituting the trapped layer 2 (coupled by exchange coupling with an antiferromagnetic layer not shown), which will further constitute the soluble electrode and be partially dissolved in the chalcogenide matrix 23 by photodissolution or heat treatment to form layer 24.

By applying to the stack so implemented a voltage above a threshold voltage, a ferromagnetic conductive filament 25 is irreversibly formed over the tunnel barrier 14. In this case too, the diameter of this conductive filament is dependent on the Vbias voltage.

The conductive filament 25 therefore becomes a spin polarized electron injection nanosource, while the free layer 1 is able to remain of micrometric size (diameter), so as to obtain better oscillation consistency and a small line width.

This embodiment allows the resistance of the device and the width of the conductive filament to be controlled by action on the Vbias voltage.

It also allows better magnetization rotation consistency in the free layer and greater straightforwardness of manufacture.

The trapped layer comprises a filament made out of cobalt for example with control of its shape anisotropy by action on the Vbias voltage. Thus, the lower the applied voltage, the narrower the filament and the greater its anisotropy. In this case, oscillations can be obtained in zero field.

If the spacer is non-conductive, a large output signal is obtained with such a device via the magnetic tunnel junction so obtained.

The spacer may however be metal, and thus act as a spin valve.

The invention claimed is:

1. A radio-frequency oscillator comprising a magnetoresistive device in which an electric current is able to flow, said magnetoresistive device comprises:
a first magnetic layer, known as "trapped layer", whereof the magnetization is of fixed direction;
a second magnetic layer known as "free layer";
a non-magnetic insulating matrix interposed between the first and second layers, the non-magnetic layer being electrically non-conductive; and
a soluble metal electrode being at least partially dissolved in the insulating matrix either by photodissolution (UV) or by heat treatment, the soluble metal being one of (i) a separately applied soluble electrode layer and (ii) a portion of the trapped layer,
wherein the oscillator further comprises means capable of causing an electron current to flow in said layers constituting the magnetoresistive device and in a direction perpendicular to the plane which contains said layers;
wherein the magnetoresistive device further comprises at least one constriction zone of the electric current passing through the magnetoresistive device,
wherein the at least one constriction zone is constituted by a nano-path or nano-wire extending through the insulating matrix and said soluble metal electrode dissolved therein, and
wherein the nano-path or nano-wire results from the subjection of the insulating matrix to a voltage suitable for generating the nano-path or nano-wire.

2. The radio-frequency oscillator as claimed in claim 1, wherein the insulating matrix consists of a chalcogenide selected from the group that includes GeSe, GeS, CuS, $Ag_2S$.

3. The radio-frequency oscillator as claimed in claim 1, wherein the insulating matrix consists of a tunnel oxide selected from the group that includes $SiO_2$, $TiO_2$, $NiO_2$, $SrTiO_3$, MgO, $Al_2O_3$.

4. The radio-frequency oscillator as claimed in claim 1, wherein it is constituted by a number N of oscillators in parallel, corresponding to the number of electron current constriction zones implemented, said oscillators being coupled to each other by spin wave.

5. The radio-frequency oscillator as claimed in claim 1, wherein the soluble metal electrode that is at least partially dissolved in the insulating matrix is a separately applied soluble electrode is constituted by copper or silver.

6. The radio-frequency oscillator as claimed in claim 1 further comprises a tunnel oxide in contact with the free layer and the insulating matrix, which is covered in its turn with the trapped layer, wherein said soluble metal electrode being at least partially dissolved in the insulating matrix is said portion of the trapped layer.

7. The radio-frequency oscillator as claimed in claim 6, wherein the tunnel oxide consists of an oxide selected from the group that includes AlOx, MgO, StO.

8. A method for implementing a radio-frequency oscillator, comprising:
realising into a substrate an electrically conductive lower electrode, intended to implement the magnetization precession of one of the layers of a magnetic stack, deposited on said substrate,
depositing onto said substrate a first layer of a ferromagnetic material,
depositing onto said first layer, by Physical Vapour Deposition (PVD), Chemical Vapour Deposition (CVD), or by evaporation, a layer constituting an insulating matrix,
depositing onto the insulating matrix using the same technology a soluble electrode, constituted by silver or copper or zinc or indium and platinum, thereby constituting a bi-layer with the layer constituting the insulating matrix;
then subjecting the bi-layer so implemented to ultra-violet treatment or heat treatment, leading to the at least partial dissolution of the soluble electrode in the insulating matrix;

depositing onto the bi-layer subsequent to said treatment a second layer made out of ferromagnetic material, the stack resulting of the first layer made out of ferromagnetic material, the bi-layer and the second layer made out of ferromagnetic material being capable of acting as a tunnel junction;

then subjecting the whole of the stack so treated to sufficient voltage to make one or more permanent or irreversible conductive nano-paths between the first and the second layer made out of ferromagnetic material; and depositing an electrically conductive upper electrode, wherein one of the first layer and the second layer is known as a "trapped layer" whereof the magnetization is of fixed direction, while another of the first layer and the second layer is known as a "free layer".

9. A method for implementing a radio-frequency oscillator as claimed in claim 8, wherein the insulating matrix consists of a chalcogenide selected from the group that includes GeSe, GeS, GeTe, and $As_2Se$.

10. A method for implementing a radio-frequency oscillator as claimed in claim 8, wherein the insulating matrix consists of a tunnel oxide selected from the group that includes $SiO_2$, $TiO_2$, $NiO_2$, $SrTiO_3$, MgO, and $Al_2O_3$.

11. A method for implementing a radio-frequency oscillator, comprising:

realising into a substrate an electrically conductive lower electrode, intended to implement the magnetization precession of one of the layers of a magnetic stack, deposited on said substrate, depositing onto said substrate a first layer made out of a ferromagnetic material, depositing onto said first layer made out of a ferromagnetic material an intermediate layer made out of an insulating or a metallic material, depositing onto the intermediate layer, by Physical Vapour Deposition (PVD), Chemical Vapour Deposition (CVD), or by evaporation, a layer constituting an insulating matrix;

then depositing onto the insulating matrix a second layer made out of a ferromagnetic material, intended to act partially as a soluble electrode, thereby constituting a bi-layer with the layer constituting the insulating matrix, the stack resulting of the first layer made out of ferromagnetic material, the bi-layer and the second layer made out of ferromagnetic material being capable of acting as a tunnel barrier or as a spin valve, depending on the nature insulating or metallic of the intermediate layer;

then subjecting the bi-layer so implemented to ultra-violet treatment or heat treatment, leading to the at least partial dissolution of the soluble electrode in the insulating matrix;

then subjecting the whole of the stack so treated to sufficient voltage to make one or more permanent or irreversible conductive nano-paths; and depositing an electrically conductive upper electrode, wherein one of the first layer and the second layer is known as a "trapped layer" whereof the magnetization is of fixed direction, while another of the first layer and the second layer is known as a "free layer".

12. The method as claimed in claim 11, wherein the insulating matrix consists of a chalcogenide selected from the group that includes GeSe, GeS, GeTe, and $As_2Se$.

* * * * *